(12) United States Patent
Baur et al.

(10) Patent No.: US 10,439,096 B2
(45) Date of Patent: Oct. 8, 2019

(54) METHOD FOR MANUFACTURING AT LEAST ONE OPTOELECTRONIC SEMICONDUCTOR CHIP

(71) Applicant: OSRAM Opto Semiconductors GmbH, Regensburg (DE)

(72) Inventors: Johannes Baur, Regensburg (DE); Lutz Hoeppel, Alteglofsheim (DE)

(73) Assignee: OSRAM OPTO SEMICONDUCTORS GMBH, Regensburg (DE)

( * ) Notice: Subject to any disclaimer, the term of this patent is extended or adjusted under 35 U.S.C. 154(b) by 175 days.

(21) Appl. No.: 15/524,618

(22) PCT Filed: Nov. 3, 2015

(86) PCT No.: PCT/EP2015/075602
§ 371 (c)(1),
(2) Date: May 4, 2017

(87) PCT Pub. No.: WO2016/071340
PCT Pub. Date: May 12, 2016

(65) Prior Publication Data
US 2018/0301590 A1 Oct. 18, 2018

(30) Foreign Application Priority Data
Nov. 5, 2014 (DE) .......... 10 2014 116 141

(51) Int. Cl.
*H01L 33/00* (2010.01)
*H01L 33/40* (2010.01)
(Continued)

(52) U.S. Cl.
CPC ........ *H01L 33/005* (2013.01); *H01L 31/0203* (2013.01); *H01L 31/02005* (2013.01);
(Continued)

(58) Field of Classification Search
CPC .............. H01L 33/005; H01L 33/0079; H01L 33/0095; H01L 33/405; H01L 31/02005; H01L 31/02327
See application file for complete search history.

(56) References Cited

U.S. PATENT DOCUMENTS 5,990,559 A * 11/1999 Marsh .................. H01G 4/005
257/306
2003/0197170 A1 10/2003 Bader et al.
(Continued)

FOREIGN PATENT DOCUMENTS

DE 102009058796 A1 6/2011
DE 102013107971 A1 1/2015
(Continued)

*Primary Examiner* — Phuc T Dang
(74) *Attorney, Agent, or Firm* — McDermott Will & Emery LLP (57) ABSTRACT

Disclosed is an optoelectronic semiconductor chip (10) comprising: —a succession of semiconductor layers (1) that has a main plane of extension, an active layer (12) and a bottom surface (1c); —a substrate (41) that is arranged on the bottom surface (1c) of the succession of semiconductor layers (1) and has a base surface (41c) facing away from the bottom surface (1c); and —a succession of joining layers (3) which is arranged in at least some locations between the succession of semiconductor layers (1) and the substrate (41) in a vertical direction; wherein —the substrate (41) laterally protrudes from the succession of semiconductor layers (1) by a maximum of 10 μm.

6 Claims, 4 Drawing Sheets

(51) Int. Cl.

| | |
|---|---|
| *H01L 33/44* | (2010.01) |
| *H01L 31/02* | (2006.01) |
| *H01L 31/0203* | (2014.01) |
| *H01L 31/0232* | (2014.01) |
| *H01L 31/18* | (2006.01) |
| *H01L 33/52* | (2010.01) |
| *H01L 33/62* | (2010.01) |
| *H01L 33/42* | (2010.01) |
| *H01L 33/46* | (2010.01) |
| *H01L 33/48* | (2010.01) |

(52) U.S. Cl.
CPC ........ *H01L 31/02327* (2013.01); *H01L 31/18* (2013.01); *H01L 33/0079* (2013.01); *H01L 33/0095* (2013.01); *H01L 33/405* (2013.01); *H01L 33/44* (2013.01); *H01L 33/52* (2013.01); *H01L 33/62* (2013.01); *H01L 33/42* (2013.01); *H01L 33/46* (2013.01); *H01L 33/486* (2013.01); *H01L 2933/0033* (2013.01); *H01L 2933/0066* (2013.01)

(56) References Cited

U.S. PATENT DOCUMENTS

| | | |
|---|---|---|
| 2006/0105542 A1 | 5/2006 | Yoo |
| 2008/0006836 A1 | 1/2008 | Lee |
| 2009/0029499 A1 | 1/2009 | Nakahara |
| 2011/0049730 A1 | 3/2011 | Schmid et al. |
| 2011/0159615 A1* | 6/2011 | Lai ................. H01L 33/0079 438/29 |
| 2011/0198665 A1 | 8/2011 | Furukawa |
| 2012/0049227 A1* | 3/2012 | Chen ................. H01L 33/20 257/98 |
| 2012/0132953 A1 | 5/2012 | Becker et al. |
| 2013/0020589 A1 | 1/2013 | Yu et al. |
| 2014/0080287 A1* | 3/2014 | Zull ................. H01L 31/18 438/463 |

FOREIGN PATENT DOCUMENTS

| | | |
|---|---|---|
| EP | 1906460 A2 | 4/2008 |
| WO | 2011073027 A1 | 6/2011 |
| WO | 2012164437 A2 | 12/2012 |
| WO | 2013045576 A1 | 4/2013 |
| WO | 2014095556 A1 | 6/2014 |

* cited by examiner

METHOD FOR MANUFACTURING AT LEAST ONE OPTOELECTRONIC SEMICONDUCTOR CHIP

The document US 2003/0197170 A1 describes a method for manufacturing an optoelectronic semiconductor chip and an optoelectronic semiconductor chip.

A problem to be solved consists in providing a simplified method for manufacturing an optoelectronic semiconductor chip with increased luminous efficiency. A further problem to be solved consists in providing an optoelectronic semiconductor chip with increased luminous efficiency and an optoelectronic semiconductor component having such an optoelectronic semiconductor chip.

A method for manufacturing at least one optoelectronic semiconductor chip is provided. The optoelectronic semiconductor chip is intended for the emission and/or detection of light. The optoelectronic semiconductor chip can be e.g. a light-emitting diode chip and/or a photodiode chip.

According to at least one embodiment of the method, a laminar structure is first provided. The laminar structure comprises a semiconductor layer sequence having an active layer, a bottom surface and a top surface facing away from the bottom surface. The active layer is designed to generate and/or detect light.

The semiconductor layer sequence can comprise a first semiconductor layer and a second semiconductor layer, between which the active layer can be arranged. The first semiconductor layer can be e.g. an n-type semiconductor layer and the second semiconductor layer a p-type semiconductor layer. For example, the second semiconductor layer has the bottom surface on a side facing away from the active layer. In this case, the first semiconductor layer has the top surface on a side facing away from the bottom surface and the active layer.

The semiconductor layer sequence has a main extension plane in which it extends in lateral directions. A main plane of the semiconductor layer sequence forms the bottom surface of the semiconductor layer sequence. Perpendicular to the main extension plane, in a vertical direction, the semiconductor layer sequence has a thickness. The thickness of the semiconductor layer sequence is small compared with the maximum extension of the semiconductor layer sequence in the main extension plane.

The laminar structure furthermore comprises a carrier, which is arranged on the bottom surface of the semiconductor layer sequence. The carrier has a base surface facing away from the bottom surface. The base surface can form e.g. an exposed external surface of the laminar structure. In other words, the base surface can be freely accessible from outside and can outwardly terminate the laminar structure. The carrier can be an electrically conductive carrier, which can be formed e.g. using silicon. Preferably, the carrier is not a growth substrate used for the growth of the semiconductor layer sequence. For example, the semiconductor layer sequence was first grown epitaxially on a growth substrate and the growth substrate was then removed. The semiconductor layer sequence is therefore in particular free from a growth substrate.

The laminar structure furthermore comprises a connecting layer sequence, which is arranged between the semiconductor layer sequence and the carrier in the vertical direction, at least in some areas. The connecting layer sequence can in particular comprise multiple layers. For example, the connecting layer sequence comprises a first connecting layer facing towards the carrier and a second connecting layer facing away from the carrier. The connecting layer sequence can completely cover a top surface of the carrier facing away from the base surface. The purpose of the connecting layer sequence is in particular the mechanical connection (so-called bonding) of the carrier to the semiconductor layer sequence.

According to at least one embodiment of the method, a plurality of separation trenches are formed in the laminar structure. This formation takes place along a singulation pattern using at least one directional dry etching method. The singulation pattern can be e.g. a mask layer applied on the top surface of the semiconductor layer sequence. The dry etching method used is at least partially a strongly anisotropic dry etching method. In other words, the formation of the separation trenches takes place directionally, preferably in a vertical direction. For example, the dry etching method takes place using a chlorine plasma and/or a fluorine plasma. The addition of argon to the plasma is optionally possible. The use of argon in conjunction with a chlorine and/or fluorine plasma makes it possible in particular to provide a mechanically eroding constituent, while this plasma primarily enters into a chemical reaction with the material of the layers to be eroded.

The formation of the separation trenches takes place such that at least one separation trench has a maximum extension of no more than 30 µm in at least one lateral direction. Furthermore, the maximum extension can be at least 5 µm. The maximum extension of the separation trench here is the maximum width of the separation trench in a lateral direction, in particular perpendicular to a main extension direction of the separation trench. Preferably, the maximum width is determined within the separation trench and not in the vicinity of the base surface and/or top surface. For example, the vertical distance of the maximum width from the base surface and/or top surface is at least 20 µm. In the external regions of the separation trench, in the vicinity of the base surface or top surface, the separation trench can be of wider configuration as a result of the dry etching method.

The formation of the plurality of separation trenches furthermore takes place such that each separation trench penetrates the laminar structure completely in the vertical direction. In other words, the laminar structure is severed or breached by the separation trench. It is in particular possible here that the separation trenches are connected together. In other words, the separation trenches can be in a continuous form. Preferably, the separation trenches laterally enclose parts of the laminar structure completely. In other words, as a result of the separation trenches, the laminar structure is preferably no longer of continuous configuration. These parts then form the optoelectronic semiconductor chips to be produced in the further method.

According to at least one embodiment of the method, the laminar structure is singulated along the separation trenches and thus at least one optoelectronic semiconductor chip is produced. Preferably, a plurality of optoelectronic semiconductor chips are produced. The at least one singulated optoelectronic semiconductor chip comprises part of the semiconductor layer sequence, of the carrier and of the connecting layer sequence.

According to at least one embodiment of the method for manufacturing at least one optoelectronic semiconductor chip, this comprises the following steps: a) providing a laminar structure comprising a semiconductor layer sequence having a main extension plane, an active layer and a bottom surface, a carrier, which is arranged on the bottom surface of the semiconductor layer sequence, and a base surface facing away from the bottom surface, and a connecting layer sequence, which is arranged between the semiconductor layer sequence and the carrier in a vertical direction, at least in some areas, b) forming a plurality of separation trenches in the laminar structure along a singulation pattern using at least one directional dry etching method, wherein at least one separation trench has a maximum extension of no more than 30 μm in at least one lateral direction and each separation trench completely penetrates the laminar structure in the vertical direction, c) singulating the laminar structure along the separation trenches to produce at least one optoelectronic semiconductor chip, wherein the at least one singulated optoelectronic semiconductor chip comprises in each case part of the semiconductor layer sequence, of the carrier and of the connecting layer sequence.

The method steps can in particular [be] carried out in the specified order.

In the present case, the idea being pursued is in particular to provide a method for manufacturing at least one optoelectronic semiconductor chip in which, because of the use of a strongly directional dry etching method, particularly narrow separation trenches can be formed. As a result, a large part of the laminar structure can be used in the optoelectronic semiconductor chips and thus low epitaxial material scrap can be achieved. Furthermore, such a method can be more readily incorporated into an existing process flow. A simple and inexpensive method for manufacturing at least one optoelectronic semiconductor chip can thus be provided.

In conventional manufacturing methods in which a laminar structure is singulated, in particular by means of a cutting method, sawing method and/or laser separating method, regions of the laminar structure, in particular of the semiconductor layer sequence and active layer, are reserved far beyond the cut width actually needed for defining and implementing the separation trenches for singulation so that inaccuracies in adjustment and/or inhomogenities, e.g. in the thermal expansion of the layers of the laminar structure, can be tolerated without damaging the active layers of the optoelectronic semiconductor chip to be manufactured. In these conventional methods, the separation trenches typically have a maximum lateral extension of at least 50 μm. Depending on the lateral extension of the optoelectronic semiconductor chip to be produced, such a separation trench can destroy a large part of the epitaxial surface employed, in particular of the active layer of the laminar structure. For example, such a separation trench with a lateral extension of 200 μm requires more than 50% of the epitaxial surface employed.

According to at least one embodiment of the method, the formation of the separation trenches in step b) requires multiple steps, as explained in more detail below. To form the separation trenches, firstly the semiconductor layer sequence is partially removed in the region of the separation trenches to be produced. The production of the separation trenches is thus carried out from above. Here and below, the directional instruction "from above" means "coming from the top surface". Conversely, here and below, the directional instruction "from below" means "coming from the bottom surface".

The separation trenches to be produced are defined e.g. using a mask layer applied on to the top surface of the semiconductor layer sequence. The partial removal of the semiconductor layer sequence preferably takes place using a directional dry etching method, in which e.g. a chlorine plasma is employed in conjunction with argon. Furthermore, the partial removal of the semiconductor layer sequence takes place such that the semiconductor layer sequence is completely penetrated by the partially produced separation trench.

According to at least one embodiment of the method, after the partial removal of the semiconductor layer sequence, the connecting layer sequence is also partially removed in the region of the partially removed semiconductor layer sequence. The partial removal of the connecting layer sequence also takes place using a directional dry etching method. For example, for the partial removal of the connecting layer sequence a fluorine plasma can be employed in conjunction with argon.

According to at least one embodiment of the method, after the partial removal of the connecting layer sequence an ALD layer is applied to all exposed external surfaces of the laminar structure facing away from the base surface. The ALD layer in the present case is a layer produced by atomic layer deposition (ALD). Layers produced by atomic layer deposition are known e.g. from the US published patent applications US 2011/0049730 A1 and US 2012/0132953 A1, the disclosure content of which is hereby incorporated by reference. A layer produced by atomic layer deposition is suitable as an encapsulating layer and in particular exhibits low permeability to moisture. As a result, the migration stability of the optoelectronic semiconductor chip to be manufactured can be achieved without loss of space. In particular, the ALD layer covers all exposed surfaces of the connecting layer sequence and of the semiconductor layer sequence immediately after being applied. The ALD layer can be formed in particular using Al2O3.

According to at least one embodiment of the method, after the ALD layer is applied, it is partially removed from the top surface of the carrier in the region of the separation trenches to be produced. For the removal, e.g. a directional dry etching method is used. During the partial removal of the ALD layer from the top surface of the carrier, the ALD layer can also be removed from the top surface of the semiconductor layer sequence, at least in some areas. After the partial removal of the ALD layer, the top surface of the carrier is freely accessible in the region of the separation trench. The other regions of the top surface of the carrier are covered e.g. by the connecting layer sequence.

According to at least one embodiment of the method, after the partial removal of the ALD layer, the carrier is partially removed. The removal takes place in the region of the partially removed semiconductor layer sequence and the partially removed connecting layer sequence. In other words, the partial removal of the carrier takes place in the region of the separation trenches to be produced. The partial removal of the carrier preferably also takes place using a dry etching method. After the partial removal of the carrier, the separation trench preferably penetrates the laminar structure completely. In other words, the partial removal of the carrier preferably takes place as far as the base surface.

According to at least one embodiment of the method, the formation of the separation trenches in step b) comprises the following steps: b1) partial removal of the semiconductor layer sequence in the region of the separation trenches to be produced, b2) partial removal of the connecting layer sequence in the region of the partially removed semiconductor layer sequence, b3) application of an ALD layer to all exposed external surfaces of the laminar structure facing away from the base surface, b4) partial removal of the ALD layer from a top surface of the carrier facing away from the base surface in the region of the separation trenches to be produced, b5) partial removal of the carrier in the region of the partially removed semiconductor layer sequence and of the partially removed connecting layer sequence, wherein for steps b1), b2) and b5) a dry etching method is at least partially used.

The specified method steps b1) to b5) can in particular be carried out in the specified order.

According to at least one embodiment of the method, the ALD layer is removed in step b4) from all exposed external surfaces of the semiconductor layer sequence, of the singulation pattern and/or of the carrier running along the main extension plane within the limits of manufacturing tolerances. Preferably, the ALD layer is completely removed from the top surface of the carrier in the region of the separation trench to be produced and from the top surface of the semiconductor layer sequence or in the event that the top surface of the semiconductor layer sequence is covered by a mask layer, which serves as a singulation pattern, from a mask layer top surface facing away from the top surface of the semiconductor layer sequence. The removal takes place using a directional etching method, such as e.g. a dry etching method.

According to at least one embodiment of the method, the laminar structure furthermore comprises a radiation-reflecting contact layer sequence arranged between the connecting layer sequence and the semiconductor layer sequence. "Radiation-reflecting" here and below means that at least 90%, preferably at least 95%, of radiation hitting the contact layer sequence is reflected by the contact layer sequence. The contact layer sequence preferably borders the semiconductor layer sequence and the connecting layer sequence directly. In this case, the contact layer sequence is preferably in direct electrical contact with a second semiconductor layer of the semiconductor layer sequence. The contact layer sequence is at least partially in an electrically conductive form.

The contact layer sequence comprises a metal layer, which is formed using a metal or consists of a metal. The metal layer is removed to produce the separation trenches in method step b) with at least partial use of a wet chemical etching method. Lateral surfaces of the metal layer can then exhibit traces of material erosion by means of a wet chemical etching method. For example, the metal layer contains or consists of silver. Furthermore, the metal layer can contain or consist of aluminum. In the case of silver in particular, the use of a dry etching method is difficult to achieve, which is why the use of a wet chemical etching method is advantageous. Further layers of the contact layer sequence can be removed e.g. using a dry etching method.

To enable the dry etching method used in preceding method steps to be stopped on the metal layer at the right time, an additional stop layer can be introduced into the contact layer sequence for this purpose. The stop layer is formed e.g. using a nitride or an oxide. The stop layer can be applied on a side of the metal layer facing away from the carrier. During the partial removal of the other layers of the contact layer sequence by means of a dry etching method, the spectral emission of the reactants produced during dry etching can be investigated. When the spectral emission indicates that the stop layer has been reached, the dry etching method can be stopped and etching can be continued by wet chemical means. As a result, formation of e.g. silver fluoride due to the dry etching of silver can be avoided.

According to at least one embodiment of the method, all exposed external surfaces of the semiconductor layer sequence are cleaned in step b) and/or after step c). For example, the cleaning takes place before the ALD layer is applied in step b3). The cleaning takes place in such a way that traces of a material of the connecting layer sequence and/or of the contact layer sequence are removed from the exposed external surfaces of the semiconductor layer sequence. During the dry etching method, traces of an electrically conductive material, such as e.g. a metal, can reach the external surfaces of the semiconductor layer sequence as a result of erosion with the plasma, where they can cause a short-circuit. These traces can be removed by cleaning, e.g. under high pressure.

Furthermore, an optoelectronic semiconductor chip is provided. The optoelectronic semiconductor chip can preferably be manufactured using a method as described here. In other words, all features disclosed for the method are also disclosed for the optoelectronic semiconductor chip and vice versa.

The optoelectronic semiconductor chip comprises a part of the laminar structure described above in connection with the manufacturing method, in particular a part of the semiconductor layer sequence, of the carrier, of the connecting layer sequence and optionally of the contact layer sequence. Below, singulated constituents of the optoelectronic semiconductor chip are referred to using the same terms as the original constituents of the laminar structure, from which these singulated constituents originate. The singulated constituents have the same function here as the original constituents. The singulated constituents here are a part of the original constituents.

According to at least one embodiment of the optoelectronic semiconductor chip, this comprises a semiconductor layer sequence with the main extension plane, the active layer, the bottom surface and a radiation passage surface facing away from the bottom surface. The semiconductor layer sequence comprises the first semiconductor layer and the second semiconductor layer. Furthermore, the optoelectronic semiconductor chip comprises the carrier, which is arranged on the bottom surface of the semiconductor layer sequence and comprises the base surface facing away from the bottom surface, and a connecting layer sequence, which is arranged between the semiconductor layer sequence and the carrier in the vertical direction, at least in some areas. The carrier projects beyond the semiconductor layer sequence laterally by no more than 10 μm. The carrier can furthermore project beyond the semiconductor layer sequence laterally by at least 2 μm. In other words, the carrier and the semiconductor layer sequence exhibit a similar extension laterally.

In particular, the optoelectronic semiconductor chip is a so-called chip-size package. In a chip-size package of this type, the total lateral extension of the optoelectronic semiconductor chip is a maximum of 130%, preferably 120%, of the lateral extension of the radiation passage surface of the optoelectronic semiconductor chip. The optoelectronic semiconductor chip therefore has a high luminous efficiency per covered surface.

According to at least one embodiment of the optoelectronic semiconductor chip, the connecting layer sequence is made of an electrically insulating material. The connecting layer sequence then forms a dielectric bond connection. The connecting layer sequence can comprise e.g. the first connecting layer and the second connecting layer, wherein the second connecting layer is in direct contact with the top surface of the carrier. The first connecting layer can be formed using silicon nitride and/or silicon oxide. The second connecting layer can comprise e.g. silicon oxide and/or silicon. Preferably, materials that can be readily severed chemically and/or by a plasma process are used for the connecting layer sequence.

In a dielectric bond connection, a connection is achieved between the carrier and further layers of the semiconductor chip by covalent bonding of the dielectric connections of the connecting layer sequence. Because of the electrically insulating form of the connecting layer sequence, the carrier is electrically insulated from the semiconductor layer sequence and/or optionally from the contact layer sequence.

According to at least one embodiment of the optoelectronic semiconductor chip, the connecting layer sequence is made of an electrically conductive material. The first connecting layer and the second connecting layer can each be formed using a metal alloy. For example, the first connecting layer of the connecting layer sequence comprises titanium, platinum, nickel and/or tin. The second connecting layer can be formed e.g. using nickel, tin and/or titanium. It is furthermore possible that at least one of the two connecting layers contains gold and/or silver. An electrically conductive connecting layer sequence is therefore preferably a metallic bond connection. For example, the metallic bond connection is made by soldering. The carrier is then electrically connected to at least one semiconductor layer of the optoelectronic semiconductor chip via the connecting layer sequence.

According to at least one embodiment of the optoelectronic semiconductor chip, the first connecting layer and the second connecting layer each have a thickness of at least 0.4 µm and no more than 1.5 µm. It is possible here that the first connecting layer and the second connecting layer each contain a metal or are formed using a metal. The particularly thin design of the first connecting layer and the second connecting layer makes it possible to use a dry etching method even for metallic layers to produce an separation trench through the connecting layer sequence. Alternatively, the first connecting layer and the second connecting layer can also be severed by a wet chemical etching method.

According to at least one embodiment of the optoelectronic semiconductor chip, all lateral surfaces of the carrier running vertically to the base surface and/or to the top surface of the carrier within the limits of manufacturing tolerances exhibit traces of material erosion by means of a dry etching method. The traces of material erosion can be a curl or shell pattern (so-called scallops). The lateral surfaces then exhibit e.g. grooves and/or notches, these grooves extending along a lateral direction. With the aid of the traces of material erosion, it can be demonstrated on the finished optoelectronic semiconductor chip that a dry etching method has been employed for singulation.

According to at least one embodiment of the optoelectronic semiconductor chip, the optoelectronic semiconductor chip is encapsulated laterally by the ALD layer. The radiation passage surface of the optoelectronic semiconductor chip is free from the ALD layer in this case. Furthermore, the lateral surfaces of the carrier are free from the ALD layer. In particular, the radiation passage surface and/or the lateral surfaces of the carrier can be completely free from the ALD layer. In particular, an external surface of the optoelectronic semiconductor chip facing away from the carrier can be completely free from the ALD layer.

By means of the fact that the encapsulation of the optoelectronic semiconductor chip is only lateral, it can therefore be established on the finished optoelectronic semiconductor chip that the ALD layer has been removed with at least partial use of a dry etching method. The purpose of the lateral encapsulation with the ALD layer here is in particular the electrical insulation with the active layer of the semiconductor layer sequence and its protection from external influences, such as e.g. the penetration of moisture.

According to at least one embodiment of the optoelectronic semiconductor chip, the first connecting layer and the second connecting layer are made of different materials. In the case of an electrically insulating connecting layer sequence, the first connecting layer can consist of silicon nitride and/or silicon oxide while the second connecting layer can consist of silicon oxide and/or silicon. In the case of an electrically conductive connecting layer sequence, the first connecting layer and second connecting layer can consist of different metal alloys. The purpose of the different materials of the two connecting layers here is to improve the connection of the carrier to the other layers of the optoelectronic semiconductor chip.

According to at least one embodiment of the optoelectronic semiconductor chip, this comprises the radiation-reflecting contact layer sequence arranged between the connecting layer sequence and the semiconductor layer sequence. The contact layer sequence here is preferably in direct contact with the semiconductor layer sequence and the connecting layer sequence. The contact layer sequence is in an electrically conductive form, at least in some areas. In particular, the contact layer sequence can be electrically connected to the semiconductor layer sequence and/or the connecting layer sequence.

The contact layer sequence comprises an oxide layer, an insulating structure and the metal layer. The oxide layer is preferably formed using a transparent conductive oxide, such as e.g. indium tin oxide. The oxide layer preferably borders the second semiconductor layer of the semiconductor layer sequence directly and is in direct electrical contact with the second semiconductor layer.

The insulating structure is arranged between the metal layer and the oxide layer at least in some regions. The insulating structure comprises a material in an electrically insulating form, such as e.g. silicon oxide. The insulating structure in the present case can be a patterned silicon oxide layer in a multiply or non-simply connected form. It is possible here that the silicon oxide layer has recesses and/or openings, which form patterned regions of the insulating structure. For example, the metal layer is arranged between the patterned regions of the insulating structure. In other words, the insulating structure directly borders the metal layer and the oxide layer. It is possible here that the metal layer penetrates the insulating structure in some areas and directly borders the oxide layer in these areas.

Multiple advantages are obtained through the use of a contact layer sequence that contains in particular an insulating structure instead of a single metal layer. For instance, the reflectivity of the contact layer sequence is increased by comparison with a single metal layer. The contact layer sequence can therefore in particular form a dielectric mirror or be formed in the manner of a dielectric mirror. Furthermore, the mechanical adhesion of the contact layer to the semiconductor layer sequence and the connecting layer sequence can be increased by the use of multiple layers. For example, the oxide layer exhibits increased mechanical adhesion to the second semiconductor layer by comparison with a metal layer.

According to at least one embodiment of the optoelectronic semiconductor chip, this has a lower lateral extension in the region of the metal layer than in regions outside the metal layer. This lower lateral extension is in particular due to the use of the wet chemical etching method. For instance, a wet chemical etching method generally has a more isotropic etching action than a dry etching method, and therefore etching also takes place in a lateral direction (so-called undercutting). The lower lateral extension of the metal layer thus allows the use of the wet chemical etching method to be demonstrated. For example, the lateral extension of the metal layer is lower than the lateral extension of the carrier and/or the semiconductor layer sequence by at least 0.5 μm to no more than 3 μm along the same lateral direction.

According to at least one embodiment of the optoelectronic semiconductor chip, lateral surfaces of the metal layer exhibit traces of material erosion by means of a wet chemical etching method. For example, the lateral surfaces of the metal layer have grooves and/or notches and/or roughenings. It is possible in this case that, with the aid of the traces of material erosion, it can be demonstrated on the finished optoelectronic semiconductor chip that the metal layer was severed using a wet chemical etching method.

According to at least one embodiment of the optoelectronic semiconductor chip, at least one through-connection is present, which extends through the carrier completely. Furthermore, the through-connection extends at least partially through the connecting layer sequence. The through-connection is preferably in direct contact with the contact layer sequence and is electrically connected to the contact layer sequence. The through-connection is in a conductive form, at least in some areas. The through-connection can be a so-called through-silicon via. A through-connection of this type comprises among other materials an electrically conductive metal, such as e.g. copper.

In a connecting layer sequence in an electrically insulating form, the carrier in an electrically conductive form is electrically insulated from the semiconductor layer sequence and the contact layer sequence by the connecting layer sequence. A simple electrical connection of the semiconductor layer sequence by means of the electrically conductive carrier is therefore impossible. Accordingly, the through-connection through the carrier is necessary.

It is furthermore possible that a further through-connection is present, which extends through the carrier, the connecting layer sequence, the contact layer sequence, the first semiconductor layer and the active layer into the second semiconductor layer and is in direct electrical contact with the second semiconductor layer. The further through-connection can then be electrically insulated from the carrier, the connecting layer sequence, the contact layer sequence, the first semiconductor layer and the active layer.

The through-connection and the further through-connection are preferably each freely accessible and electrically bondable at the base surface of the carrier. It is possible here that the through-connection and the further through-connection are each electrically insulated from the carrier.

When through-connections are used, a direct electrical bonding of the metal of the through-connection is possible. In this case, the carrier itself does not have to perform an electrical current-carrying function or does not serve an electrical bonding purpose. Thus, there is no need for a sometimes poorly adhering metal-semiconductor contact with the material of the carrier on the base surface.

According to at least one embodiment of the optoelectronic semiconductor chip, the active layer and a second semiconductor layer of the semiconductor layer sequence are completely covered laterally by regions of the insulating structure. In other words, all lateral surfaces of the active layer and of the second semiconductor layer running along the vertical direction within the limits of manufacturing tolerances are completely covered by regions of the insulating structure. For example, the covering regions of the insulating structure are of thicker configuration at lateral marginal regions of the optoelectronic semiconductor chip than in the inside of the optoelectronic semiconductor chip.

As a result, it is possible that the regions of the insulating structure project beyond the oxide layer of the contact layer sequence in a vertical direction and encapsulate the aforementioned lateral surfaces. It is possible in this case that the second semiconductor layer and/or the active layer no longer directly border the ALD layer or (where no ALD layer is provided) are no longer freely accessible laterally.

It is furthermore possible that the optoelectronic semiconductor chip has out-coupling structures on the radiation passage surface. In the lateral interstices between the out-coupling structures, a contact surface of planar configuration, which can be part of the radiation passage surface, can be produced. On this contact surface, current ribs can be provided which can serve to improve the electrical bonding of the first semiconductor layer. In particular, these current ribs can be in a reflective form and can reflect radiation generated by the active layer and emitted in the direction of the current ribs back into the semiconductor layer sequence.

Furthermore, an optoelectronic semiconductor component is provided. The optoelectronic semiconductor component comprises an optoelectronic semiconductor chip as described here. In other words, all features disclosed for the optoelectronic semiconductor chip and for the manufacturing method are also disclosed for the optoelectronic semiconductor component and vice versa.

According to at least one embodiment of the optoelectronic semiconductor component, this comprises an optoelectronic semiconductor chip as described above and a molded body. The molded body is in an electrically insulating form. The molded body can be formed e.g. using an epoxy resin and/or a silicone resin. For example, the molded body can be made using a cast molding method, a compression molding method and/or an injection molding method. Preferably, the molded body is in a radiation-absorbing and/or radiation-reflecting form.

The molded body encloses the optoelectronic semiconductor chip in the manner of a frame. Furthermore, the molded body can border the ALD layer directly at least in some areas. A bottom surface of the molded body is flush with the base surface of the carrier. "In the manner of a frame" means here and below that the optoelectronic semiconductor chip is completely surrounded laterally by the molded body in a top view from above. It is possible, however, that individual layers and/or layer sequences of the optoelectronic semiconductor chip project beyond the molded body in a vertical direction. In other words, the molded body can have a lower thickness than the optoelectronic semiconductor chip in the vertical direction.

According to at least one embodiment of the optoelectronic semiconductor component, this furthermore comprises a contact body. The contact body encloses the optoelectronic semiconductor chip in the manner of a frame. Furthermore, the contact body directly borders a top surface of the molded body facing away from the bottom surface of the molded body. The contact body is formed using an electrically conductive material, such as e.g. a metal. Preferably, the contact body is in an electrically conductive and radiation-reflecting form. Because the optoelectronic semiconductor chip is enclosed by the contact body in the manner of a frame, the efficiency of the optoelectronic semiconductor chip can thus be increased since radiation losses to the side are avoided.

Furthermore, the contact body allows wireless bonding of the first semiconductor layer of the semiconductor layer sequence. To this end, the contact body can be electrically connected to the first semiconductor layer. The contact body covers the radiation passage surface at least in some areas, as a result of which lateral radiation losses are reduced.

Furthermore, the optoelectronic semiconductor chip can be covered laterally at least in some areas by a further material in a radiation-reflecting form. The further material can be arranged between the carrier and the molded body at least in some areas. As a result, lateral light losses can be reduced. In addition, the molded body can be protected from light-induced ageing by such a material.

According to at least one embodiment of the optoelectronic semiconductor component, the molded body projects beyond the carrier in a vertical direction. This allows in particular an outward insulation of the electrically conductive carrier. It is possible here that the molded body also projects beyond the connecting layer sequence in a vertical direction. For example, only optoelectronic semiconductor chip constituents in an electrically insulating form, such as e.g. the insulating structure or the ALD layer, are freely accessible laterally from the outside. From above or below, constituents in an electrically conductive form can also be freely accessible.

The method described here, the optoelectronic semiconductor chip described here and the optoelectronic semiconductor component described here are explained in more detail below with the aid of exemplary embodiments and the associated figures.

Identical or similar elements or elements having the same effect are provided with the same reference numbers in the figures. The figures and the size ratios to one another of the elements illustrated in the figures should not be considered as being to scale. Rather, to illustrate them better and/or to make them easier to understand, the size of individual elements may be exaggerated.

Figure 1:
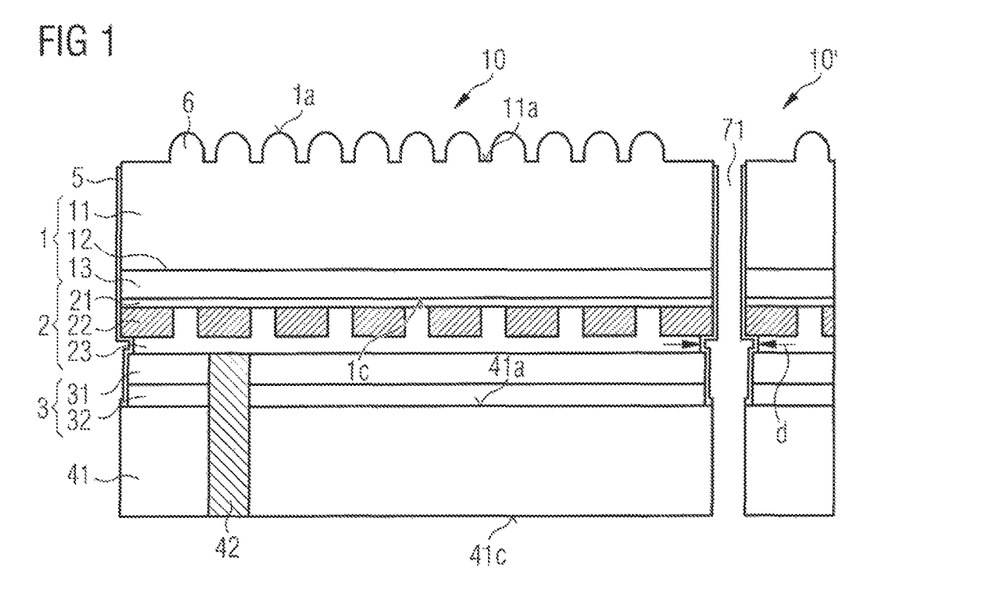
FIG. 1 shows an exemplary embodiment of an optoelectronic semiconductor chip as described here with the aid of a cross-sectional diagram.

FIG. 1 shows an exemplary embodiment of an optoelectronic semiconductor chip 10 as described here and of a method as described here for manufacturing an optoelectronic semiconductor chip 10 with the aid of a cross-sectional diagram. The optoelectronic semiconductor chip 10 is separated laterally by a separation trench 71 from a further optoelectronic semiconductor chip 10' (not illustrated completely).

The optoelectronic semiconductor chip 10 has a semiconductor layer sequence 1 with a radiation passage surface 1a and a bottom surface 1c facing away from the radiation passage surface 1a. The semiconductor layer sequence 1 comprises a first semiconductor layer 11, which can be e.g. an n-type semiconductor layer, an active layer 12, which serves to generate and/or detect radiation, and a second semiconductor layer 13, which can be e.g. a p-type semiconductor layer. The active layer 12 is arranged between the first semiconductor layer 11 and the second semiconductor layer 13.

The radiation passage surface 1a is provided with out-coupling structures 6. The out-coupling structures 6 in the present case are evenly arranged roughenings in the first semiconductor layer 11 which are spaced apart. For example, the out-coupling structures 6 can have the shape of an elliptical segment in the illustrated cross-section. Between the out-coupling structures 6, planar contact surfaces 11a of the first semiconductor layer 11 are located. These contact surfaces 11a can be used e.g. for the additional electrical bonding of the first semiconductor layer 11 with current ribs 111 (cf. FIG. 4).

On the bottom surface 1c of the semiconductor layer sequence 1, the contact layer sequence 2 is arranged. The contact layer sequence 2 comprises the oxide layer 21, the insulating structure 22 and the metal layer 23. The oxide layer 21 is formed using a conductive oxide and is in a radiation-transmitting form. The oxide layer 21 directly borders the second semiconductor layer 13 and is in direct electrical contact therewith.

In a top view from above, the metal layer 23 is simply connected and in a continuous form and penetrates the insulating structure 22 at least in some areas. The metal layer 23 is in direct electrical contact with the oxide layer 21. The metal layer 23 is preferably formed using silver and/or aluminum.

The insulating structure 22 is arranged between the oxide layer 21 and the metal layer 23 at least in some areas. The insulating structure 22 has circular openings in evenly distributed areas. In other words, in a top view, the insulating structure 22 is in a multiply connected form. In these areas, the insulating structure 22 is penetrated by the metal layer 23. The insulating structure 22 directly borders the oxide layer 21 and the metal layer 23.

On the side of the contact layer sequence 2 facing away from the bottom surface 1c, a connecting layer sequence 3 is arranged. The connecting layer sequence 3 comprises a first connecting layer 31 facing towards the contact layer sequence 2 and a second connecting layer 32 facing away from the contact layer sequence 2. On the second connecting layer 32, the carrier 41 is arranged with the carrier top surface 41a facing towards the connecting layer sequence 3 and the base surface 41c facing away from the connecting layer sequence 3. The base surface 41c in the present case forms an exposed external surface of the optoelectronic semiconductor chip 10. The carrier top surface 41a is in direct contact with the second connecting layer 32. The carrier 41 is mechanically connected to the contact layer sequence 2 and the semiconductor layer sequence 1 by means of the connecting layer sequence 3.

The first connecting layer 31 is in direct contact with the metal layer 23 of the contact layer sequence 2. The second connecting layer 32 is in direct contact with the carrier 41. In the exemplary embodiment of the optoelectronic semiconductor chip 10 shown here, the connecting layer sequence 3 is formed using an electrically insulating material. As a result, the carrier 41 is electrically insulated from the contact layer sequence 2 by the connecting layer sequence 3. In order to allow a bonding of the contact layer sequence 2, a through-connection 42 is provided. The through-connection 42 penetrates the carrier 41 and the connecting layer sequence 3 completely. The through-connection 42 directly borders the contact layer sequence 2 and is in direct electrical contact with the contact layer sequence 2.

Laterally, the optoelectronic semiconductor chip 10 is at least partially covered by an ALD layer 5 and encapsulated thereby in an electrically insulating manner. In particular, all lateral surfaces of the semiconductor layer sequence 1, the contact layer sequence 2 and the connecting layer sequence 3 running along the vertical direction within the limits of manufacturing tolerances are covered by the ALD layer.

In the exemplary embodiment shown, the singulating step of the method as described here has already been performed. Laterally next to the optoelectronic semiconductor chip 10, a further optoelectronic semiconductor chip 10' is arranged. The further optoelectronic semiconductor chip 10' is separated from the first optoelectronic semiconductor chip 10 by a separation trench 71. The separation trench has a maximum lateral extension d of no more than 30 μm, preferably no more than 20 μm. Preferably, the maximum extension d is located in the region of the metal layer 23. This is due to the fact that the metal layer 23 was severed in the method using a wet chemical etching method and therefore undercutting, i.e. a lateral etching of the metal layer 23, has taken place. As a result, the metal layer 23 has a lower lateral extension than the other layers of the optoelectronic semiconductor chip 10, 10'.

Figure 2:
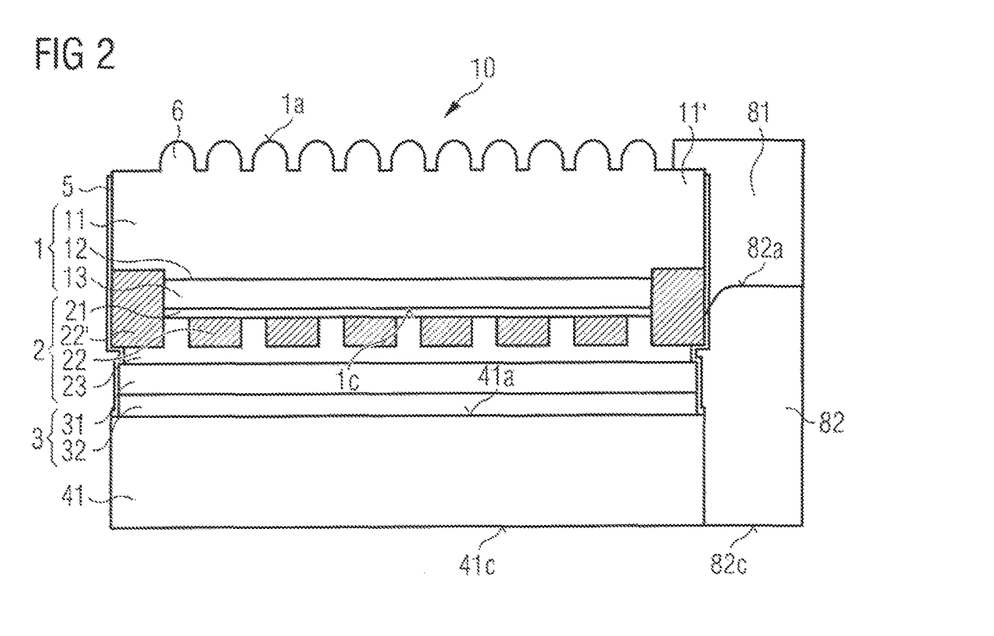
FIGS. 2, 3 and 4 show exemplary embodiments of an optoelectronic semiconductor component as described here with the aid of top view diagrams.

According to the cross-sectional diagram of FIG. 2, an exemplary embodiment of an optoelectronic semiconductor component is explained in more detail. The optoelectronic semiconductor component comprises an optoelectronic semiconductor chip 10, a molded body 82 and a contact body 81. The molded body 82 directly borders the optoelectronic semiconductor chip 10 at least in some areas and laterally surrounds it completely in a top view. A molded body bottom surface 82c is flush with the base surface 41c. A molded body top surface 82a facing away from the molded body bottom surface 82c projects beyond the carrier 41 and the connecting layer sequence 3 completely in a vertical direction.

The molded body top surface 82a is not in a flat or planar form. Rather, the molded body top surface 82a exhibits a curvature. In particular, the molded body 82 has a lower thickness in regions at a lower lateral distance from the optoelectronic semiconductor chip 10 than in regions at a greater lateral distance from the optoelectronic semiconductor chip 10. This notching of the molded body 81 at the optoelectronic semiconductor chip 10 is due to the production method.

The contact body 81 directly borders the molded body top surface 82a. The contact body 81 is in direct electrical contact with the first semiconductor layer 11. For this purpose, the contact body 81 covers the radiation passage surface 1a at least in some areas. For example, the contact body 81 is in a radiation-reflecting form. The contact body 81 can be applied on to the molded body 82 e.g. by electroplating.

In contrast to the exemplary embodiment of FIG. 1, the optoelectronic semiconductor chip 10 does not have a through-connection 42. In the present case, the connecting layer sequence 3 is therefore formed using an electrically conductive material, such as e.g. a metal. The electrical bonding of the second semiconductor layer 13 then takes place by means of the carrier 41 which is in an electrically conductive form.

The optoelectronic semiconductor chip 10 furthermore has regions of the insulating structure 22' which laterally cover the second semiconductor layer 13 and the active layer 12 completely. In particular, the regions of the insulating structure 22' cover the lateral surfaces of the active layer and of the second semiconductor layer 13 completely. The active layer 12 and the second semiconductor layer 13 therefore no longer directly border the ALD layer 5. An electrical bonding of the second semiconductor layer 13 is possible by means of the contact layer sequence 2.

Figure 3:
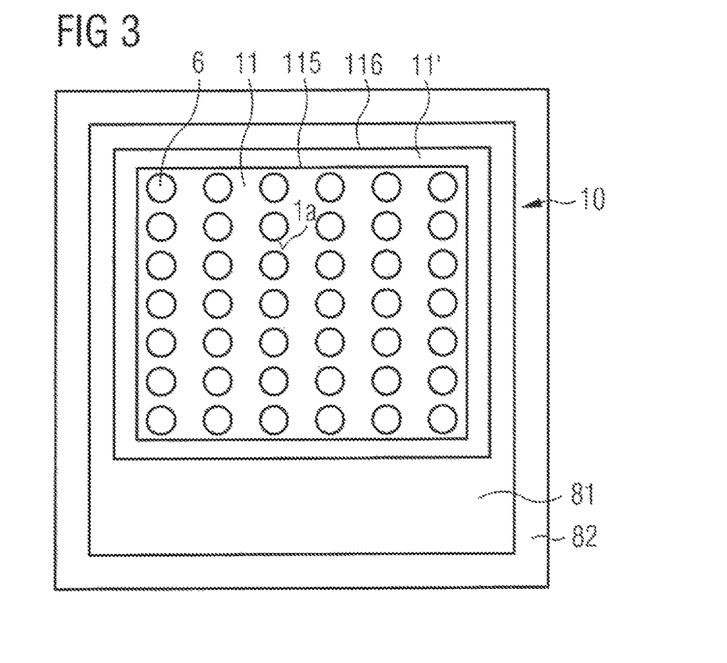

With the aid of the top view diagram of FIG. 3, an exemplary embodiment of an optoelectronic semiconductor component as described here is explained in more detail. The top view here is from above, i.e. on to the radiation passage surface 1a.

The optoelectronic semiconductor component comprises an optoelectronic semiconductor chip 10. The optoelectronic semiconductor chip 10 is enclosed by the contact body 81 and the molded body 82 in the manner of a frame. Regions 11' of the radiation passage surface 1a are covered by the contact body 81 here. This partial covering is indicated in the top view shown by the separating line 115 and the lateral chip termination 116. The chip termination 116 corresponds here to the external surfaces of the optoelectronic semiconductor chip 10 running along the vertical direction. The out-coupling structures 6 are arranged on the radiation passage surface 1a in the form of a regular grid.

Figure 4:
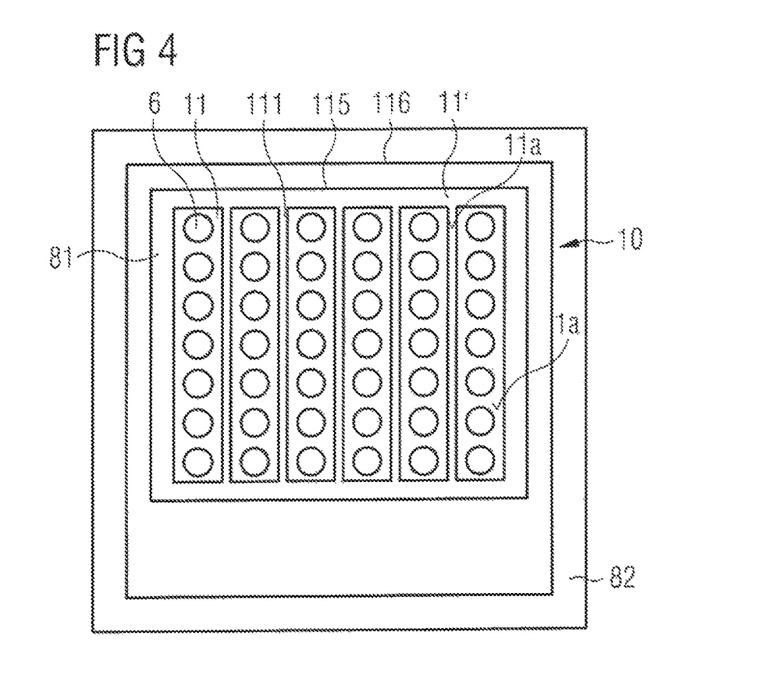

According to the top view diagram of FIG. 4, a further exemplary embodiment of an optoelectronic semiconductor component as described here is explained in more detail. The exemplary embodiment differs from that in FIG. 3 through the fact that current ribs 111 are arranged on the radiation passage surface 1a between the out-coupling structures 6, said current ribs are in particular formed in one piece with the contact body 81. Alternatively, the current ribs 111 can also be formed using another material and only electrically connected to the contact body 81. The current ribs 111 are in the present case arranged in a linear manner between rows of the out-coupling structures 6. The purpose of the current ribs 111 is in particular an improved current distribution over the first semiconductor layer 11. Furthermore, the current ribs can be in a radiation-reflective form, thus increasing the efficiency of the optoelectronic semiconductor component.

Figure 5:
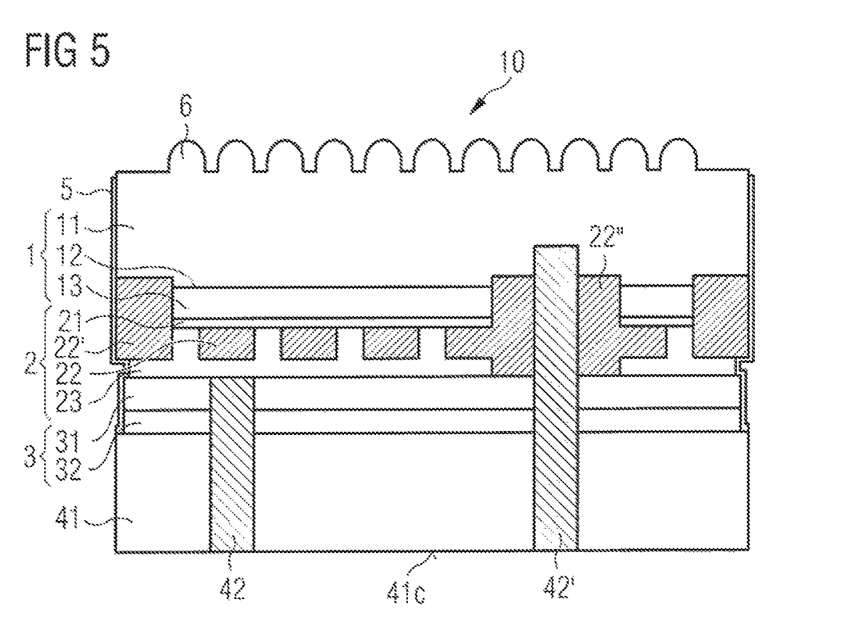
FIG. 5 shows an exemplary embodiment of an optoelectronic semiconductor chip as described here with the aid of a cross-sectional diagram.

According to the cross-sectional diagram of FIG. 5, a further exemplary embodiment of an optoelectronic semiconductor chip as described here is explained in more detail. In the illustrated exemplary embodiment, the optoelectronic semiconductor chip 10 is designed as a so-called "chip-size package". For the electrical bonding of the semiconductor layers 11, 13, two through-connections 42, 42' are provided. A first through-connection 42 extends completely through the carrier 41 and the connecting layer sequence 3 to the contact layer sequence 2 and is electrically connected to the contact layer sequence 2 and thus with the second semiconductor layer 13.

A second through-connection 42' extends completely through the carrier 41, the connecting layer sequence 3, the contact layer sequence 2, the second semiconductor layer 13 and the active layer 12. The second through-connection 42' is electrically connected to the first semiconductor layer 11. In the region of the contact layer sequence 2, the second semiconductor layer 13 and the active layer 12, the second through-connection 42' is surrounded by further regions of the insulating structure 22". The purpose of these further regions of the insulating structure 22" is the electrical insulation of the second through-connection 42' from the contact layer sequence 2, the second semiconductor layer 13 and the active layer 12.

Figure 6A:
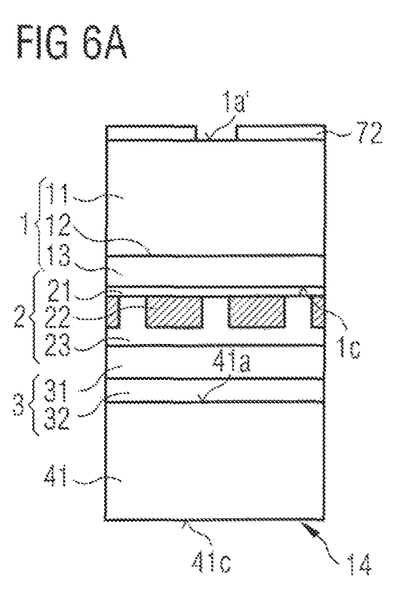
FIGS. 6A, 6B, 6C and 6D show an exemplary embodiment of a method as described here with the aid of a cross-sectional diagram.

According to the cross-sectional diagrams of FIGS. 6A, 6B, 6C and 6D, method steps of a method as described here are explained in more detail. FIG. 6A shows a first method step of a method as described here. Firstly, a laminar structure 14 is provided with a semiconductor layer sequence 1, a contact layer sequence 2, a connecting layer sequence 3 and a carrier 41. On a top surface 1a' of the laminar structure 14, a mask layer 72 is applied. The mask layer 72 forms a singulation pattern 72 of the laminar structure 14.

Figure 6B:
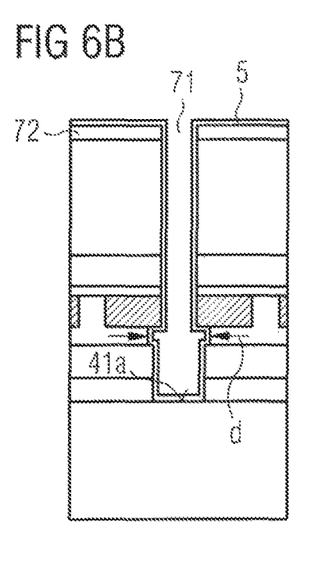

According to the cross-sectional diagram of FIG. 6B, a further method step of a method as described here is explained in more detail. In the laminar structure 14, with at least partial use of a dry etching method, a separation trench 71 is produced, which extends in the present case as far as the carrier top surface 41a. The metal layer 23 can have been severed by means of a wet chemical etching method here. The production of the separation trench 71 takes place here in exposed regions of the top surface 1a' not covered by the mask layer 72.

After the partial production of the separation trench 71, an ALD layer 5 is applied to exposed external surfaces of the laminar structure 14 over the whole surface.

Figure 6C:
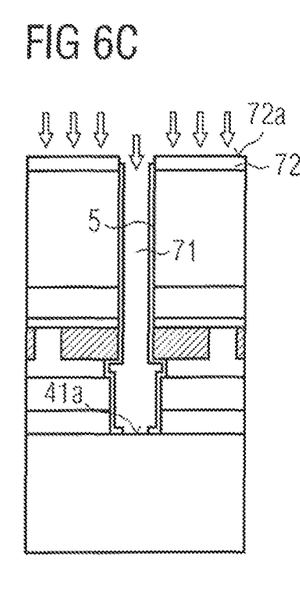

According to the cross-sectional diagram of FIG. 6C, a further method step of a method as described here is explained in more detail. In the present case, all external surfaces running along the main extension direction of the carrier 41 are freed from the ALD layer 5 by a directional dry etching method (arrows in FIG. 6C). The carrier top surface 41a is then freely accessible in the region of the separation trench 71. Furthermore, a mask layer top surface 72a facing away from the carrier 41 is freely accessible after the partial removal of the ALD layer 5.

Figure 6D:
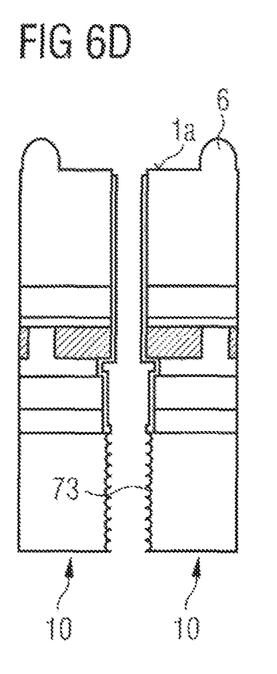

According to the cross-sectional diagram of FIG. 6D, a further method step of a method as described here is explained in more detail. In the method step shown, the carrier 41 is severed in the region of the separation trench 71 using a dry etching method. The separation trench 71 then extends through the laminar structure 14 completely. As a result, a singulation of the laminar structure 14 into individual optoelectronic semiconductor chips 10 is possible along the separation trench 71. Because of the dry etching method, the carrier exhibits traces of singulation 73 by the dry etching method in the region of the separation trench 71. These traces of singulation 73 exhibit a scale-like or scallop-like pattern. The traces of singulation 73 can extend along a lateral direction. With the aid of these traces of singulation 73, therefore, the method used can be demonstrated on the finished optoelectronic semiconductor chip 10.

The method described here is inexpensive and allows the provision of an efficient optoelectronic semiconductor chip. When the laminar structure is severed using a dry etching method, perpendicular edges are obtained and furthermore slight undercuts in the metal layer due to the use of the wet chemical etching method. These slight undercuts can also be controlled in a targeted manner. Using so-called spacer technology or encapsulation with an ALD layer or other moisture-proof dielectric layers, migration stability can be created without loss of lateral space. Area loss is substantially determined by the maximum extension of the separation trench and can be less than 15 µm in extreme cases. At the same time, preferably no radiation-absorbing layers are employed in this design.

The description with the aid of the exemplary embodiments does not limit the invention thereto. Rather, the invention comprises any new feature and any combination of features, which in particular includes any combination of features in the patent claims, even if this feature or this combination is not itself explicitly stated in the patent claims or exemplary embodiments.

The present application claims the priority of the German application DE 10 2014 116 141.6, the disclosure content of which is hereby incorporated by reference.

LIST OF REFERENCE NUMBERS

10 Optoelectronic semiconductor chip
1 Semiconductor layer sequence
11, 11' First semiconductor layer
11a Contact surface
111 Current ribs
115 Separating line
116 Chip termination
12 Active layer
13 Second semiconductor layer
1a' Top surface
1a Radiation passage surface
1c Bottom surface
2 Contact layer sequence
21 Oxide layer
22 Insulating structure
22', 22" Regions of the insulating structure
23 Metal layer
41 Carrier
41c Base surface
41a Carrier top surface
42, 42' Through-connection
5 ALD layer
6 Out-coupling structures
71 Separation trenches
72 Mask layer, singulation pattern
72a Mask layer top surface
73 Traces of singulation
81 Bonding
82 Molded body
82a Molded body top surface
82c Molded body bottom surface

The invention claimed is:

1. A method for manufacturing at least one optoelectronic semiconductor chip having the following steps:
   a) providing a laminar structure comprising
      a semiconductor layer sequence with a main extension plane, an active layer and a bottom surface,
      a carrier, which is arranged on the bottom surface of the semiconductor layer sequence and comprises a base surface facing away from the bottom surface, and
      a connecting layer sequence, which is arranged between the semiconductor layer sequence and the carrier in a vertical direction, at least in some areas,
   b) forming a plurality of separation trenches in the laminar structure along a singulation pattern using at least one directional dry etching method, wherein
      at least one separation trench has a maximum extension of no more than 30 µm in at least one lateral direction and
      each separation trench completely penetrates the laminar structure in the vertical direction,
   c) singulating the laminar structure along the separation trenches to produce at least one optoelectronic semiconductor chip, wherein the at least one singulated optoelectronic semiconductor chip comprises in each case a part of the semiconductor layer sequence, of the carrier and of the connecting layer sequence, wherein the formation of the separation trenches in step b) comprises the following steps:
      b1) partial removal of the semiconductor layer sequence in the region of the separation trenches to be produced,
      b2) partial removal of the connecting layer sequence in the region of the partially removed semiconductor layer sequence, b3) application of an ALD layer to all exposed external surfaces of the laminar structure facing away from the base surface,
b4) partial removal of the ALD layer from a carrier top surface of the carrier facing away from the base surface in the region of the separation trenches to be produced,
b5) partial removal of the carrier in the region of the partially removed semiconductor layer sequence and of the partially removed connecting layer sequence, wherein for steps b1), b2) and b5) a dry etching method is at least partially used.

2. The method according to claim 1,
wherein the ALD layer in step b4) is removed from all exposed external surfaces of the semiconductor layer sequence, of the singulation pattern and/or of the carrier running along the main extension plane within the limits of manufacturing tolerances.

3. The method according to claim 1,
wherein the laminar structure furthermore comprises a radiation-reflecting contact layer sequence with a metal layer arranged between the connecting layer sequence and the semiconductor layer sequence, wherein the metal layer is removed to produce the separation trenches in step b) with partial use of a wet chemical etching method.

4. The method according to claim 3,
wherein all exposed external surfaces of the semiconductor layer sequence are cleaned in step b) and/or after step c) in such a way that traces of a material of the connecting layer sequence and/or of the contact layer sequence are removed from the exposed external surfaces of the semiconductor layer sequence.

5. A method for manufacturing at least one optoelectronic semiconductor chip having the following steps:
a) providing a laminar structure comprising
a semiconductor layer sequence with a main extension plane, an active layer and a bottom surface,
a carrier, which is arranged on the bottom surface of the semiconductor layer sequence and comprises a base surface facing away from the bottom surface, and
a connecting layer sequence, which is arranged between the semiconductor layer sequence and the carrier in a vertical direction, at least in some areas,
b) forming a plurality of separation trenches in the laminar structure along a singulation pattern using at least one directional dry etching method, wherein
at least one separation trench has a maximum extension of no more than 30 μm in at least one lateral direction and
each separation trench completely penetrates the laminar structure in the vertical direction,
c) singulating the laminar structure along the separation trenches to produce at least one optoelectronic semiconductor chip, wherein the at least one singulated optoelectronic semiconductor chip comprises in each case a part of the semiconductor layer sequence, of the carrier and of the connecting layer sequence,
wherein the laminar structure furthermore comprises a radiation-reflecting contact layer sequence with a metal layer arranged between the connecting layer sequence and the semiconductor layer sequence, wherein the metal layer is removed to produce the separation trenches in step b) with partial use of a wet chemical etching method.

6. The method according to claim 5,
wherein all exposed external surfaces of the semiconductor layer sequence are cleaned in step b) and/or after step c) in such a way that traces of a material of the connecting layer sequence and/or of the contact layer sequence are removed from the exposed external surfaces of the semiconductor layer sequence.

* * * * *